US006864558B2

(12) United States Patent
Momtaz et al.

(10) Patent No.: US 6,864,558 B2
(45) Date of Patent: Mar. 8, 2005

(54) LAYOUT TECHNIQUE FOR C3MOS INDUCTIVE BROADBANDING

(75) Inventors: Afshin D. Momtaz, Irvine, CA (US); Michael M. Green, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 121 days.

(21) Appl. No.: 09/861,143

(22) Filed: May 17, 2001

(65) Prior Publication Data

US 2002/0171095 A1 Nov. 21, 2002

(51) Int. Cl.[7] .......................... H01L 29/00; H01L 25/00
(52) U.S. Cl. ...................... 257/531; 257/528; 257/536; 326/101
(58) Field of Search ................................ 257/202, 206, 257/9, 204, 208–209, 528, 531, 536; 326/101–103, 83, 115; 716/1–18

(56) References Cited

U.S. PATENT DOCUMENTS

| | | |
|---|---|---|
| 4,449,248 A | 5/1984 | Leslie et al. |
| 5,428,636 A | 6/1984 | Meier |
| 4,519,068 A | 5/1985 | Krebs et al. |
| 4,545,023 A | 10/1985 | Mizzi |
| 4,680,787 A | 7/1987 | Marry |
| 4,731,796 A | 3/1988 | Masterton et al. |
| 4,737,975 A | 4/1988 | Shafer |
| 4,761,822 A | 8/1988 | Maile |
| 4,777,657 A | 10/1988 | Gillaspie |
| 4,794,649 A | 12/1988 | Fujiwara |
| 4,804,954 A | 2/1989 | Macnak et al. |
| 4,807,282 A | 2/1989 | Kazan et al. |
| 4,817,115 A | 3/1989 | Campo et al. |
| 4,850,009 A | 7/1989 | Zook et al. |
| 4,890,832 A | 1/1990 | Komaki |
| 4,894,792 A | 1/1990 | Mitchell et al. |

(List continued on next page.)

OTHER PUBLICATIONS

Y. Kawazu et al, "Novel ELFIN (embedded–metal–layer process for fully integrated NOR) cell for 16/64 Mbit flash EEPROM", Electrincs Letters 30 (15), pp. 1209–1210 (1994).*

"A Wide Tuning Range Gated Varactor," Wong et al., *IEE Journal of Solid–State Circutis,* vol. 35, No. 5, May 2000, pp. 773–779.

Bida, *A Hybrid Wireless MAC Protocol Supporting Asynchronous and Synchronous MSDU Delivery Services,* IEEE 802.11/91–92, Sep. 1991, pp. 1–46.

Robert Meier's Master's Thesis, *Mobile Computer Network Architecture,,* (May 1993), 82 pages.

Hoberecht, *A Layered network Protocol for Packet Voice and Data Integration,* IEEE Journal on Selected Areas in Communications, vol. SAC–1, No. 6 (Dec. 1983), pp. 1006–1013.

(List continued on next page.)

*Primary Examiner*—Nathan J. Flynn
*Assistant Examiner*—Johannes Mondt
(74) *Attorney, Agent, or Firm*—Garlick Harrison & Markison LLP; Shayne X. Short

(57) ABSTRACT

An improved cell layout for a C3MOS circuit with inductive broadbanding positions the inductor at a distance from the active region to improve isolation and aligns the edges of the resistor, inductor, and transistor regions near the common edge of adjacent cells to decrease the length of the cell-to-cell interconnect lines.

11 Claims, 3 Drawing Sheets

U.S. PATENT DOCUMENTS

| | | |
|---|---|---|
| 4,916,441 A | 4/1990 | Gombrich |
| 4,964,121 A | 10/1990 | Moore |
| 4,969,206 A | 11/1990 | Desrochers |
| 4,977,611 A | 12/1990 | Maru |
| 4,995,099 A | 2/1991 | Davis |
| 5,008,879 A | 4/1991 | Fischer et al. |
| 5,025,486 A | 6/1991 | Klughart |
| 5,029,183 A | 7/1991 | Tymes |
| 5,031,231 A | 7/1991 | Miyazaki |
| 5,033,109 A | 7/1991 | Kawano et al. |
| 5,055,659 A | 10/1991 | Hendrick et al. |
| 5,055,660 A | 10/1991 | Bertagna et al. |
| 5,081,402 A | 1/1992 | Koleda |
| 5,087,099 A | 2/1992 | Stolarczyk |
| 5,117,501 A | 5/1992 | Childress et al. |
| 5,119,502 A | 6/1992 | Kallin et al. |
| 5,121,408 A | 6/1992 | Cai et al. |
| 5,123,029 A | 6/1992 | Bantz et al. |
| 5,128,938 A | 7/1992 | Borras |
| 5,134,347 A | 7/1992 | Koleda |
| 5,142,573 A | 8/1992 | Umezawa |
| 5,150,361 A | 9/1992 | Wieczorek et al. |
| 5,152,006 A | 9/1992 | Klaus |
| 5,153,878 A | 10/1992 | Krebs |
| 5,175,870 A | 12/1992 | Mabey et al. |
| 5,179,721 A | 1/1993 | Comroe et al. |
| 5,181,200 A | 1/1993 | Harrison |
| 5,230,084 A | 7/1993 | Nguyen |
| 5,239,662 A | 8/1993 | Danielson et al. |
| 5,241,542 A | 8/1993 | Natarajan et al. |
| 5,241,691 A | 8/1993 | Owen |
| 5,249,220 A | 9/1993 | Moskowitz et al. |
| 5,249,302 A | 9/1993 | Metroka et al. |
| 5,265,238 A | 11/1993 | Canova, Jr. et al. |
| 5,265,270 A | 11/1993 | Stengel et al. |
| 5,274,666 A | 12/1993 | Dowdell et al. |
| 5,276,680 A | 1/1994 | Messenger |
| 5,278,831 A | 1/1994 | Mabey et al. |
| 5,289,469 A | 2/1994 | Tanaka |
| 5,291,516 A | 3/1994 | Dixon et al. |
| 5,293,639 A | 3/1994 | Wilson et al. |
| 5,296,849 A | 3/1994 | Ide |
| 5,297,144 A | 3/1994 | Gilbert et al. |
| 5,323,392 A | 6/1994 | Ishii et al. |
| 5,331,509 A | 7/1994 | Kikinis |
| 5,349,649 A | 9/1994 | Iijima |
| 5,361,397 A | 11/1994 | Wright |
| 5,363,121 A | 11/1994 | Freund |
| 5,373,149 A | 12/1994 | Rasmussen |
| 5,373,506 A | 12/1994 | Tayloe et al. |
| 5,390,206 A | 2/1995 | Rein et al. |
| 5,392,023 A | 2/1995 | D'Avello et al. |
| 5,406,615 A | 4/1995 | Miller, II et al. |
| 5,406,643 A | 4/1995 | Burke et al. |
| 5,418,837 A | 5/1995 | Johansson et al. |
| 5,423,002 A | 6/1995 | Hart |
| 5,426,637 A | 6/1995 | Derby et al. |
| 5,430,845 A | 7/1995 | Rimmer et al. |
| 5,438,329 A | 8/1995 | Gastouniotis et al. |
| 5,440,560 A | 8/1995 | Rypinski |
| 5,465,081 A | 11/1995 | Todd |
| 5,481,265 A | 1/1996 | Russell |
| 5,481,562 A | 1/1996 | Pearson et al. |
| 5,533,029 A | 7/1996 | Gardner |
| 5,535,373 A | 7/1996 | Oinowich |
| 5,544,222 A | 8/1996 | Robinson et al. |
| 5,579,487 A | 11/1996 | Meyerson et al. |
| 5,584,048 A | 12/1996 | Wieczorek |
| 5,628,055 A | 5/1997 | Stein |
| 5,630,061 A | 5/1997 | Richter et al. |
| 5,680,633 A | 10/1997 | Koenck et al. |
| 5,732,346 A | 3/1998 | Lazaridis et al. |
| 5,740,366 A | 4/1998 | Mahany et al. |
| 5,744,366 A | 4/1998 | Kricka et al. |
| 5,796,727 A | 8/1998 | Harrison et al. |
| 5,839,051 A | 11/1998 | Grimmett et al. |
| 5,940,771 A | 8/1999 | Gollnick et al. |
| 6,014,705 A | 1/2000 | Koenck et al. |
| 6,057,555 A * | 5/2000 | Reedy et al. ............ 257/9 |
| 6,060,951 A * | 5/2000 | Inoue et al. ............ 330/307 |
| 6,374,311 B1 | 4/2002 | Mahany et al. |
| 6,424,194 B1 | 7/2002 | Hairapetian |
| 2002/0040985 A1 * | 4/2002 | Aldrich ............ 257/202 |
| 2002/0110989 A1 * | 8/2002 | Yamaguchi et al. ........ 438/311 |
| 2003/0102521 A1 * | 6/2003 | Maeda et al. ............ 257/531 |

OTHER PUBLICATIONS

Rypinski, *Architecture–Topology and Protocol Stacks*, IEEE 802. 11/91–21, Mar. 1991, 12 pages.

Cheah, *A Proposed Architecture and Access Protocol Outline for the IEEE 802.11 Radio LAN Standards*, Document IEEE P802.11/91–54, May 1991; pp. 1–20.

Rypinski, *Power–Drain Considerations for Full Time and Sleep Mode Radio Receivers*, IEEE P802.11/91–99, Sep. 1991, 11 pages.

Natarajan et al, *Battery Efficient Operation of Radio MAC Protocol*, IEEE P802.11/91–102, Sep. 1991, pp. 1–5.

Cox, *A Radio System Proposal for Widespread Low–Power Tetherless Communications*, IEEE Transactions on Communications, vol. 39, No. 2 (Feb. 1991), pp. 324–335.

Bagby, *One Approach to Wireless Network Architecture*, IEEE P802.11/91–2, Jan. 1991, 1–15, 17–21.

Biba, *A Modest Proposal for a Asynchronous, Data Intensive, Wireless Local Area Network*, IEEE P802.11/91–25, Mar. 1991; pp. 1–25.

Heimschi et al; *Merged CMOS/Bipolar Current Switch Logic (MCSL)*, IEEE Journal of Solid State Circuits, vol. 24, pp. 1307–11, Oct. 1989, p. 1307–1311.

Elrabaa et al; *Optimization of Digital BiCMOS Circuits, An Overview*, IEEE 1992, 5 pages.

Mudd et al, *Very High Speed ECL/CMG Gate Arrays with Submicron Structures*; IEEE 1989, 5 pages.

* cited by examiner

LAYOUT TECHNIQUE FOR C3MOS INDUCTIVE BROADBANDING

CROSS-REFERENCES TO RELATED APPLICATIONS

This application is related to U.S. patent application Ser. No. 09/610,905, filed Jul. 6, 2000, entitled CURRENT-CONTROLLED CMOS CIRCUITS WITH INDUCTIVE BROADBANDING which is hereby incorporated by reference for all purposes.

BACKGROUND OF THE INVENTION

The design of an integrated circuit (IC) requires that a layout be designed which specifies the arrangement of the various circuit components on the major surface of a semiconductor substrate, for example a silicon crystal.

Since many circuit elements are repeatedly utilized, these circuit elements are reduced to cells. The layout can be generated by arranging the cells and connecting them using conductive interconnects. Layout is usually performed utilizing sophisticated software tools well-known to persons of skill in the art.

The layout of the interconnects is a complex geometrical problem. However, in high frequency ICs the layout must also account for electromagnetic effects, which cause parasitic resistance and capacitance which can degrade the performance of the IC.

FIG. 1 depicts the standard design of a cell 10, a layout of two cells, and the interconnection of the cells where each cell 10 includes an inductor region 12, a resistor region 14, and a transistor region 16. An example of such a circuit is disclosed in the aforementioned application.

In FIG. 1 a first set of conductive lines 18 couples the inductor region 12 to the resistor region 14 and a second set of conductive lines 20 connects the resistor region 14 to the transistor region 16. A set of cell to cell signal interconnects 22 couples the output nodes of the first cell to the inputs of the transistor region of the second cell. All the regions 12, 14, and 16 are rectangular and have a characteristic lateral dimension: DI for the inductor region 12, DR for the resistor region 14, and DT for the transistor region. As is apparent from FIG. 1, the lateral dimension of the cell 10 is about equal to the dimension of the largest circuit element, in this case the inductor, and is about equal to DI. Because of the symmetrical design of the inductor, resistor regions, and transistor regions, the regions tend to be aligned and the length of the conductive lines connecting the regions minimized. The length of the cell-to-cell interconnects, which transmit high frequency signals, is thus very long because of the large lateral dimension of the inductor compared to the other regions.

In very high frequency applications, the interconnect parasitic resistors and capacitors form an RC network that plays a very important role. This RC network attenuates the high frequency clock and creates Inter-Symbol Interference (ISI) jitter on the data. These effects become even more important for C3MOS cells with inductive broadbanding. (The presence of the inductors in these cases changes the RC networks to RCL networks). As described above and in the referenced patent, the load here includes an inductor in series with a resistor. Since the physical size of the inductor is typically an order of magnitude bigger than the physical size of the resistor, these cells require a small area for transistors and resistors and a very large area for inductors. As depicted in FIG. 1, this makes the cell-to-cell interconnects 22 very long. Since the length of the interconnects is directly proportional to their parasitic resistance and capacitance, whatever speed improvement is gained through inductive broadbanding can be lost due to these additional parasitic effects if the layout is not done carefully. Moreover, if the inductors are close to metal or active areas, magnetic coupling further degrades the speed improvement.

BRIEF SUMMARY OF THE INVENTION

According to one aspect of the invention, an improved cell layout for a C3MOS circuit with inductive broadbanding effectively isolates the inductor region from metal and active layers and reduces the length of cell-to-cell interconnects.

According to another aspect of the invention, first and second cells have a common boundary. The inductor, resistor, and transistor regions of each cell are aligned near the common boundary to reduce the length of the cell-to-cell interconnect.

According to another aspect of the invention, the length of the conductive lines connecting the inductor region to the resistor region is greater than the length of the conductive lines connecting the resistor region to the transistor region to isolate the inductors from metalizations and active areas.

According to another aspect of the region, the parasitic capacitance of the lines connecting the inductor and resistor regions is less than 20% of the load capacitance, thereby improving circuit performance.

Other features and advantages of the invention will be apparent from the following detailed description and appended drawings.

DESCRIPTION OF THE SPECIFIC EMBODIMENTS

In one embodiment of the invention, the circuit elements are fabricated utilizing ultra-high-speed logic circuitry implemented in silicon complementary metal-oxide-semiconductor (CMOS) process technology. A distinction is made herein between the terminology "CMOS process technology" and "CMOS logic." CMOS process technology as used herein refers generally to a variety of well established CMOS fabrication processes that form a field-effect transistor over a silicon substrate with a gate terminal typically made of polysilicon material disposed on top of an insulating material such as silicon dioxide.

Figure 2:
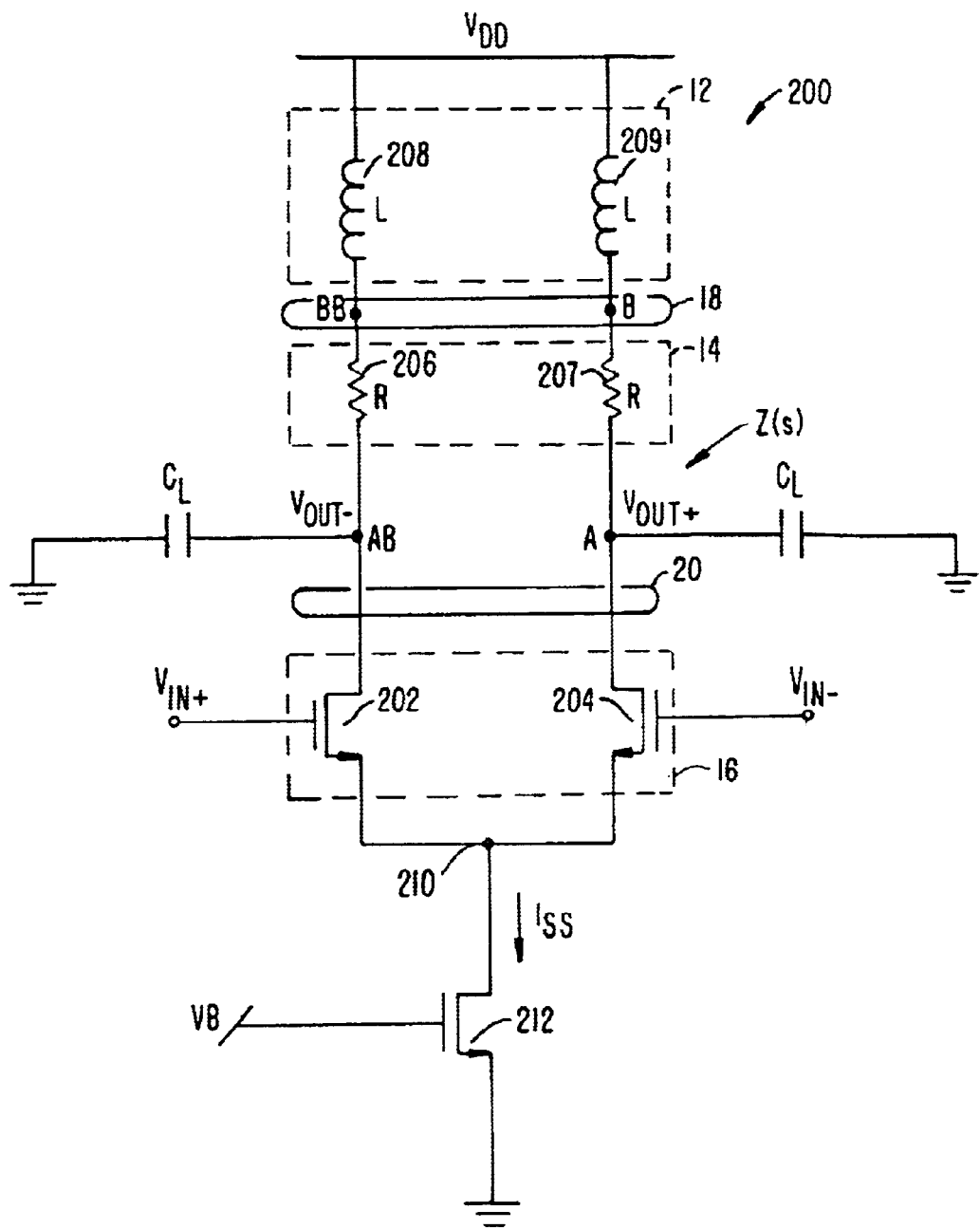
FIG. 2 is a C3MOS buffer circuit with inductive broadbanding.

FIG. 2 depicts a buffer circuit fabricated utilizing, by way of example, not limitation, C3MOS technology which is described in detail in the above-referenced patent application. It is to be understood that the present invention is useful in many contexts and is not limited to particular circuit designs.

FIG. 2 is a schematic diagram of a buffer circuit utilizing inductive broadbanding, illustrates the basic C3MOS buffer 200 with shunt inductors L, and load capacitors $C_L$. A pair of n-channel MOSFETs 202 and 204 receive differential logic signals $V_{in}+$ and $V_{in}-$ at their gate terminals, respectively. Resistive loads 206 and 207 in series with shunt inductors 208 and 209 connect the drain terminals of MOS- FETs 202 and 204, respectively, to the power supply VDD. Drain terminals of MOSFETs 202 and 204 form the outputs $V_{out}-$ and $V_{out}+$ of the differential pair, respectively. In a preferred embodiment, the shunt inductors 208 and 209 are spiral inductors coupled to the substrate utilizing standard techniques. Resistive loads 206 and 207 may be made up of either p-channel MOSFETs operating in their linear region, or resistors made up of, for example, polysilicon material. In a preferred embodiment, polysilicon resistors are used to implement resistive loads 206 and 207, which maximizes the speed of buffer 200. The source terminals of n-channel MOSFETs 202 and 204 connect at node 210. A current-source n-channel MOSFET 212 connects node 210 to ground (or negative power supply). A bias voltage VB drives the gate terminal of current-source MOSFET 212 and sets up the amount of current I that flows through buffer 200.

In FIG. 2 a first pair of nodes, A and AB, and a second pair of nodes, B and BB are depicted. The first pair of nodes are coupled to the outputs and are thus sensitive to parasitic series resistance and shunt capacitance. Accordingly, it is desirable to reduce the length of cell-to-cell interconnects coupled to the first pair of nodes as much as possible.

On the other hand, the second pair of nodes are not very sensitive to parasitic resistance and shunt capacitance so that the conductive lines between the resistor region 14 the inductor region 12 can be increased in length to increase the isolation of the inductors from other circuit elements.

Figure 1:
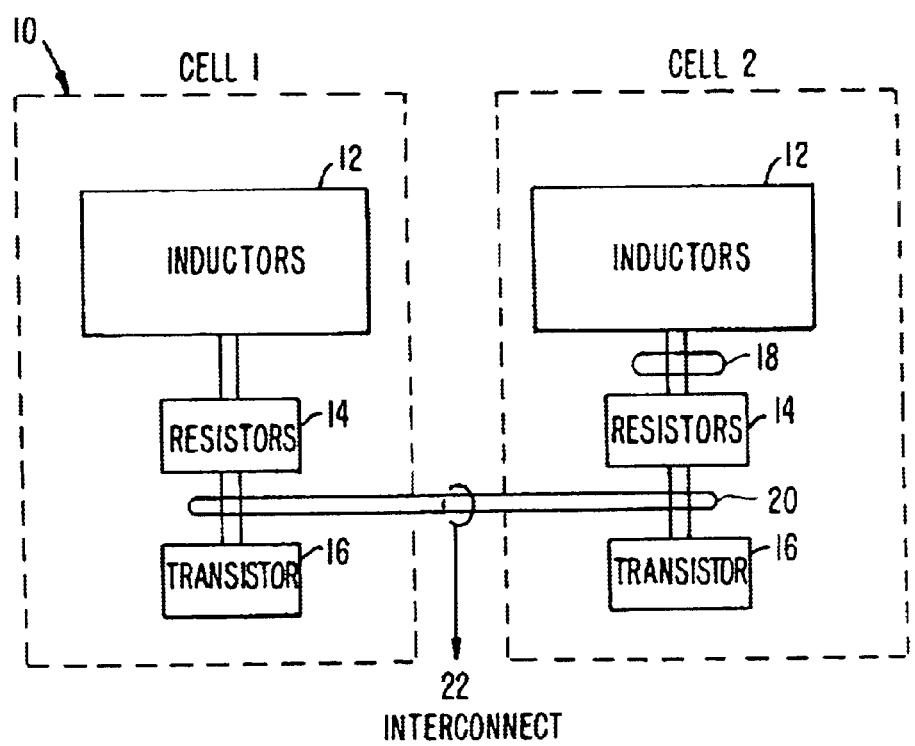
FIG. 1 is a block diagram depicting a standard cell layout.
Figure 3:
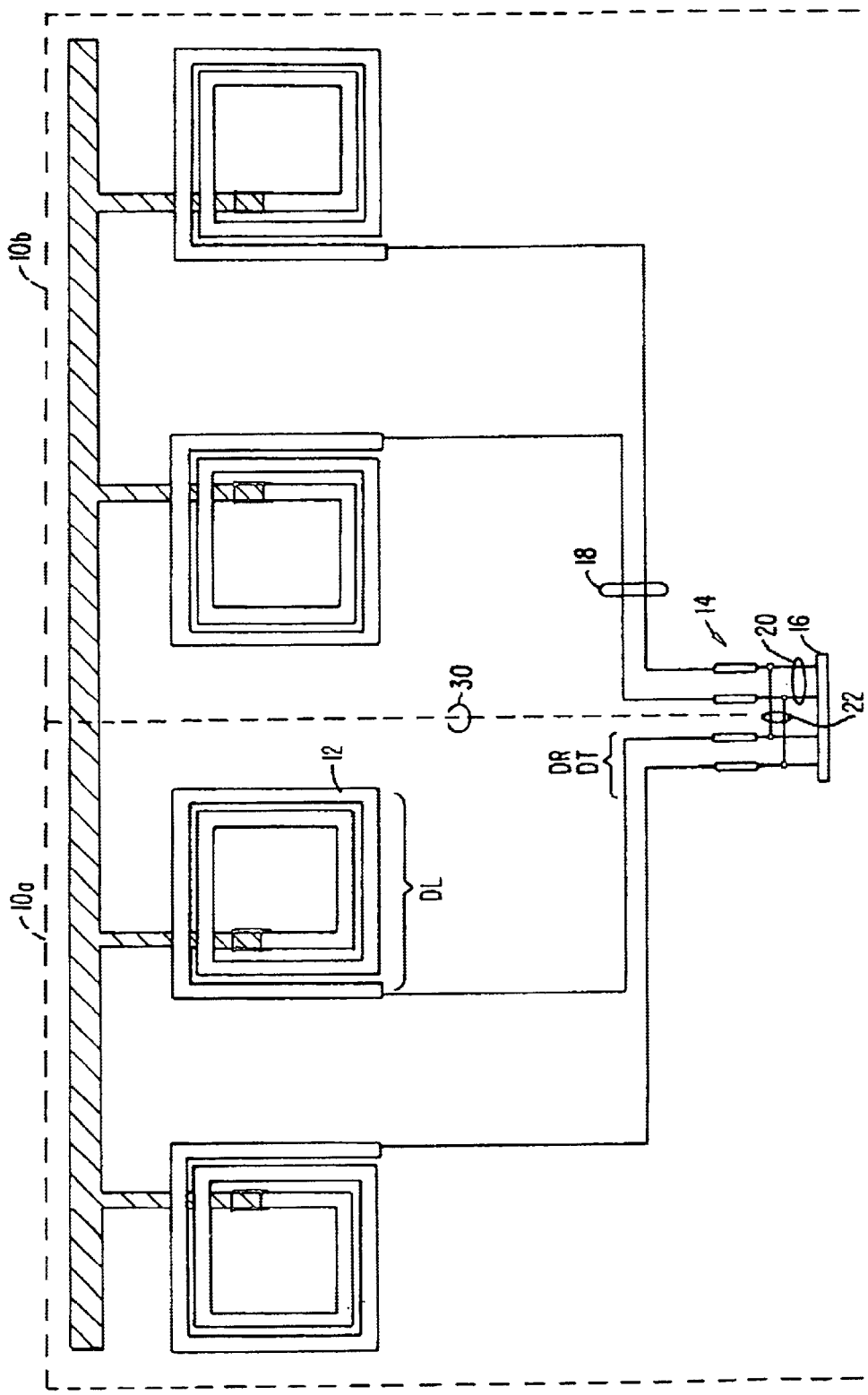
FIG. 3 depicts an embodiment of a layout cell.

FIG. 3 depicts an embodiment of a cell layout with first and second cells 10a and 10b having a common boundary 30. In FIG. 3, referring to the first cell 10a, the inductor region, resistor region, and transistor regions all have their right edges aligned so that the right edge of each region is disposed near the right edge of the cell. Similarly, referring to the second cell 10b, the inductor region, resistor region, and transistor region are all aligned so that the left edge of each region is disposed near the left edge of the cell. Because of this alignment, the signal lines connecting the output nodes of the first cell to the input nodes of the transistor region in the second cell have a reduced length compared to the signal interconnects of the standard cell in FIG. 1. This reduced length reduces the parasitic resistance and capacitance of the signal lines.

Additionally, the length of the second set of conductive lines between the resistor and transistor regions is kept small while the length of the first set of conductive lines between the inductor and resistor regions is increased to increase the isolation of the inductor region from the signal lines. For these first interconnect lines the parasitic resistance is added to the load resistance of the resistor region without degrading the bandwidth of the cell. Thus, the parasitic burden is shifted to the relatively insensitive first set of conductive lines from the highly sensitive signal interconnects.

Further, the inventors have discovered that overall performance can be improved over the case where there is no parasitic capacitance This can be explained as follows. The basis of the inductive shunt-peaking technique is to add a pair of inductors to the circuit so that the circuit's natural frequencies are changed in such a way that the circuit's transient response becomes faster. When a moderate parasitic capacitance (less than 20% of the load capacitance) is added to the first set of conductive lines, the circuit's natural frequencies change in a similar way, such that the circuit's transient response is further improved. The improvement ceases, however, if the parasitic capacitance becomes larger than 20% of the load capacitance.

The invention has now been described with reference to the preferred embodiments. Alternatives and substitutions will now be apparent to persons of skill in the art. For example, other fabrication technologies can be utilized instead of CMOS processing technology. Further, although a C3MOS buffer has been used as an exemplary embodiment, the principles of the invention are extendable to other circuits such as flip-flops, latches, etc. that include an inductor in series with a resistor. Accordingly, it is not intended to limit the invention except as provided by the appended claims.

What is claimed is:

1. A cell formed in a semiconductor substrate, said cell comprising:

a substantially rectangular inductor region, characterized by a lateral dimension, DL, and having oppositely disposed inside and outside boundaries;

a substantially rectangular resistor region, characterized by a lateral dimension, DR, where DR is substantially smaller than DL, having oppositely disposed inside and outside boundaries;

a substantially rectangular transistor region, characterized by a lateral dimension, DT, where DT is substantially smaller than DL, having oppositely disposed inside and outside boundaries;

a first set of conductive lines, of length ICA, coupling the inductor region to the resistor region; and a second set of conductive lines, of length ICB, coupling the resistor region to the transistor region where ICB is substantially smaller than ICA.

2. The cell of claim 1 where:

the outside boundaries of the substantially rectangular inductor, resistor, and transistor regions are aligned substantially adjacent to the outside boundary of the cell.

3. The cell of claim 2 where:

the resistor and transistor regions are fabricated utilizing CMOS process technology.

4. A circuit layout disposed on the major surface of a semiconductor substrate comprising:

first and second substantially rectangular inductor regions, characterized by lateral dimension, DL, and having oppositely disposed left and right boundaries, with said first and second inductor regions disposed on the major surface so that the left boundary of the first inductor region is substantially adjacent to the right boundary of the second inductor region;

first and second substantially rectangular resistor regions, characterized by a lateral dimension, DR, where DR is substantially smaller than DL, having oppositely disposed left and right boundaries with said first and second resistor regions disposed on the major surface so that the left boundary of the first resistor region is substantially adjacent to the right boundary of the second resistor region;

first and second substantially rectangular transistor regions, characterized by a lateral dimension, DT, where DT is substantially smaller than DL, having oppositely disposed left and right boundaries, with said first and second transistor regions disposed on the major surface so that the left boundary of the first transistor region is substantially adjacent to the right boundary of the second transistor region;

first and second sets of conductive lines, of length ICA, with the first set of conductive lines coupling the first inductor region to the first resistor region and with the second set of conductive lines coupling the second inductor region to the second resistor region;

third and fourth sets of conductive lines, of length ICB, with the third set of conductive lines coupling the first resistor region to the first transistor region, and with the fourth set of conductive lines coupling the second resistor region to the second transistor region, where ICB is substantially smaller than ICA so that the inductor region is isolated; and a set of signal conductive interconnect lines coupling the third set of conductive lines to the second transistor region where the length of the signal conductive interconnect lines is small so that the parasitic resistance and capacitance of the signal interconnect lines is low.

5. The circuit layout of claim 4 where:
the left boundaries of the first substantially rectangular inductor, resistor, and transistor regions are substantially aligned; and
the right boundaries of the second substantially rectangular inductor, resistor, and transistor regions are substantially aligned.

6. The cell of claim 5 where:
the first and second resistor and transistor regions are fabricated utilizing CMOS process technology.

7. A circuit layout disposed on the surface of a semiconductor substrate comprising:
first and second substantially rectangular layout cells having a common boundary:
with said first layout cell comprising:
a first cell inductor region having inside and outside edges and characterized by a lateral dimension of value DL;
a first cell resistor region having inside and outside edges and characterized by a lateral dimension of value DR;
a first cell transistor region having inside and outside edges and characterized by a lateral dimension of magnitude DT;
a first set of conductive lines coupling the first cell inductor region to the first cell resistor region; and
a second set of conductive lines coupling the first cell resistor region with the first cell transistor region, where the length of the first set of conductive lines is substantially larger than the length of the second set of conductive lines to isolate the inductor region from the transistor region:
with said second layout cell comprising:
a second cell inductor region having inside and outside edges and characterized by a lateral dimension of value DL;
a second cell resistor region having inside and outside edges and characterized by a lateral dimension of value DR;
a second cell transistor region having inside and outside edges and characterized by a lateral dimension of magnitude DT;
a third set of conductive lines coupling the second cell inductor region to the second cell resistor region; and
a fourth set of conductive lines coupling the second cell resistor region with the second cell transistor region, where the length of the third set of conductive lines is substantially larger than the length of the fourth set of conductive lines to isolate the inductor region from the transistor region;
where the inside edges of the first cell inductor, resistor, and transistor regions are aligned substantially adjacent to the common edge of the first and second layout cell and where the inside edges of the second cell inductor, resistor, and transistor regions are aligned substantially adjacent to the common edge of the first and second layout cells; and
signal interconnect lines coupling the second set of conductive lines in the first layout cell to the transistor region in the second layout cell, where the alignment of the inside edges of the inductor, resistor, and transistor regions of the first and second layout cells with common edge of the cells facilitates shortening the signal interconnect lines.

8. The cell of claim 1 further comprising:
load capacitance regions coupled to the first set of conductive lines; and wherein:
the length of the first set of conductive lines has a parasitic capacitance of less than about 20% of the capacitance of the load capacitance region.

9. The cell of claim 1 wherein the substantially rectangular resistor region comprises a resistor.

10. The cell of claim 1 wherein the substantially rectangular inductor region, the substantially rectangular resistor region and the substantially rectangular transistor region are disposed at mutually exclusive locations in the cell.

11. The circuit layout of claim 4 wherein the inductor region is isolated from the set of signal conductive interconnect lines.

* * * * *